United States Patent [19]

Tham et al.

[11] Patent Number: 5,880,921
[45] Date of Patent: Mar. 9, 1999

[54] MONOLITHICALLY INTEGRATED SWITCHED CAPACITOR BANK USING MICRO ELECTRO MECHANICAL SYSTEM (MEMS) TECHNOLOGY

[75] Inventors: J.L. Julian Tham, Irvine, Calif.; James L. Bartlett, Cedar Rapids, Iowa; Mau Chung F. Chang, Thousand Oaks, Calif.; Henry O. Marcy, 5th, Camarillo, Calif.; Deepak Mehrotra, Thousand Oaks, Calif.; Kenneth D. Pedrotti, Thousand Oaks, Calif.; David R. Pehlke, Thousand Oaks, Calif.; Charles W. Seabury, Calabasas, Calif.; Jun J. Yao, Thousand Oaks, Calif.

[73] Assignee: Rockwell Science Center, LLC, Thousand Oaks, Calif.

[21] Appl. No.: 848,116

[22] Filed: Apr. 28, 1997

[51] Int. Cl.$^6$ ........................................ H01G 23/00
[52] U.S. Cl. .......................... 361/233; 361/234; 334/55; 333/262
[58] Field of Search ................... 361/233, 234; 257/418, 419, 773, 784; 307/109; 334/55; 333/262; 200/181

[56] References Cited

U.S. PATENT DOCUMENTS

| | | | |
|---|---|---|---|
| 4,890,063 | 12/1989 | Haragashira | 334/55 |
| 5,121,089 | 6/1992 | Larson | 333/107 |
| 5,313,083 | 5/1994 | Schindler | 257/48 |
| 5,367,136 | 11/1994 | Buck | 200/600 |
| 5,485,131 | 1/1996 | Fajen et al. | 333/202 |
| 5,578,976 | 11/1996 | Yao | 333/262 |

OTHER PUBLICATIONS

Young et al., "A Micromachined Variable Capacitor for Monolithic Low–Noise VCOS", Solid State Sensor and Actuator Workshop, Hilton Head, South Carolina, Jun. 2–6, 1996, pp. 86–89.

Paul Bauhahn, "Micromachining for Microwave Devices and Circuits", Contact No.: F33615–95–C–1340, CDRL A008. Interim Report for Sep. 1993 to Aug. 1995, pp. 6 and 10.

Yao et al., "A Surface Micromachined Minature Switch for Telecommunications Applications with Signal Frequencies from DC up to 4Ghz" In Tech. Digest, Transducer–95, Stockholm, Sweden, Jun. 25–29, 1995, pp. 384–387.

K. Petersen, "Micromechanical Membrane Switches on Silicon", *IBM J. Res. Develop.*, vol. 23, 1979, pp. 376–385.

Gretillat et al., "Electrostatic Polysilicon Microrelays Integrated with MOSFETS", in proceedings of *Micro Electro Mechanical Systems Workshop*, 1994, pp. 97–101.

*Primary Examiner*—Richard T. Elms
*Assistant Examiner*—Kim Huynh
*Attorney, Agent, or Firm*—Koppel & Jacobs

[57] ABSTRACT

A monolithically integrated switched capacitor bank using MEMS technology that is capable of handling GHz signal frequencies in both the RF and millimeter bands while maintaining precise digital selection of capacitor levels over a wide tuning range. Each MEMS switch includes a cantilever arm that is affixed to the substrate and extends over a ground line and a gapped signal line. An electrical contact is formed on the bottom of the cantilever arm positioned above and facing the gap in the signal line. A top electrode atop the cantilever arm forms a control capacitor structure above the ground line. A capacitor structure, preferably a MEMS capacitor suspended above the substrate at approximately the same height as the cantilever arm, is anchored to the substrate and connected in series with a MEMS switch. The MEMS switch is actuated by applying a voltage to the top electrode, which produces an electrostatic force that attracts the control capacitor structure toward the ground line, thereby causing the electrical contact to close the gap in the signal line and connect the MEMS capacitor structure between a pair of output terminals. The integrated MEMS switch-capacitor pairs have a large range between their on-state and off-state impedance, and thus exhibit superior isolation and insertion loss characteristics.

28 Claims, 6 Drawing Sheets

MONOLITHICALLY INTEGRATED SWITCHED CAPACITOR BANK USING MICRO ELECTRO MECHANICAL SYSTEM (MEMS) TECHNOLOGY

BACKGROUND OF THE INVENTION

1. Field of the Invention

This invention relates to switched capacitor banks and more specifically to a monolithically integrated switched capacitor bank and fabrication method using micro electro mechanical system (MEMS) technology.

2. Description of the Related Art

Switched capacitor banks are used in microelectronics, especially in the area of RF and Millimeter band communications, to adjust the resonance of a tunable resonator, to alter the transfer function of or to tune a filter, or to match a load impedance of an amplifier. The capacitor bank's performance is evaluated based upon a number of different factors, including its capability of precisely selecting a plurality of capacitance levels over a wide tuning range, linearity, maximum signal and switching frequencies, Q (quality factor), power consumption, isolation, insertion loss, sensitivity to its surrounding environment (vibration, temperature, etc.), and integration. The requirements and relative importance of these different factors depend upon the specific application.

Figure 1:
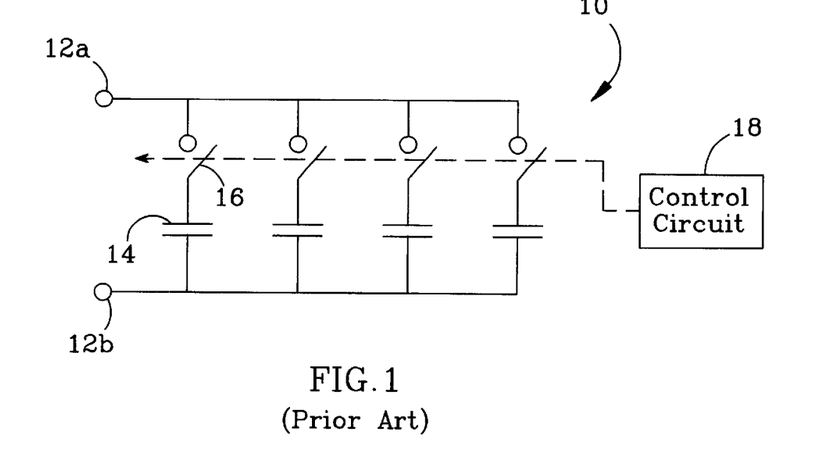
FIG. 1, as described above, is a schematic diagram of a known switched capacitor bank.

As shown in FIG. 1, a switched capacitor bank 10 includes an array of series-connected switch-capacitor pairs that are connected in parallel between a pair of output terminals 12a and 12b. Ideally the capacitor 14 has no associated resistance or inductance and the switch 16 has zero on-impedance and infinitely high off-impedance. A control circuit 18 switches a digital voltage signal to control the state of each switch 16 in the array to connect and disconnect the capacitors 14 and set the total capacitance seen at the output terminals 12a and 12b to one of a plurality of levels. The total capacitance of the switched capacitor bank is the summation of the capacitances of the switch-capacitor pairs that are connected in parallel. The capacitors can be arranged, for example, such that the switched capacitor bank has a logarithmic behavior; or they can be arranged to have an equal value so that the switched capacitor bank has a linear behavior. More typically, switched capacitor bank 10 consists of capacitors with binary values, i.e., C, 2C, 4C, 8C, etc., which provides a large range of possible capacitance values or a large capacitance ratio.

In one known implementation, discrete mechanical relays are wire bonded to discrete capacitors and controlled by a discrete control circuit. The mechanical relays' metal-to-metal contacts provide high isolation and low insertion losses. The discrete capacitors are formed on glass substrates to minimize their parasitic capacitance. As a result, the switched capacitor bank can be precisely tuned over a large range at very high RF (200 MHz-30 GHz) and millimeter (30 GHz-94 GHz) band frequencies. However, the lack of integration increases both the size and cost to the point that such a system is not feasible in current microelectronic applications.

In another known implementation, the switched capacitor bank and control circuitry are fabricated on a monolithic substrate using conventional planar IC fabrication techniques to form pairs of parallel-plate capacitors, either a metal-oxide-metal or a heavily doped polysilicon-oxide-polysilicon, and FET switches on the surface of the substrate. Integration is essential to minimize cost and to facilitate a large array. The integration of FET switches is a well understood and highly reliable process, in which the resulting devices are very high speed, in excess of 100 MHz, and insensitive to vibrations.

However, the parallel plate capacitors are associated with serial and/or parallel resistors and inductors. In addition, there is a parasitic capacitive coupling between the capacitor and the substrate, which creates an AC path for the high frequency signal to leak to the substrate. Furthermore, the semiconducting nature of the FET switch produces a non-zero insertion loss (typically 1 dB) in the on-state and a less-than-infinite isolation (typically no better than −30 dB) in the off-state. These losses, which increase with signal frequency, limit the capacitor bank's tuning range, level precision, maximum signal frequency, Q, etc. As a result, monolithically integrated switched capacitor banks are limited to applications having frequencies less than 500 MHz or to low-performance applications at higher frequencies.

Consequently, RF transceivers that operate at frequencies above approximately 1 GHz use multiple chip sets that are fabricated with different technologies to optimize the capacitors, the FET switches, and the control circuitry, respectively, to get satisfactory insertion loss and isolation. For example, the capacitors may be formed on a glass substrate, the FET switches on a gallium arsenide substrate, and the control circuitry on a silicon substrate.

MEMS have been used in such applications as pressure sensors, accelerometers, and nozzles, and have been proposed for use in RF telecommunications systems. In particular, a number of different types of MEMS switches have been developed. Petersen, K. "Micromechanical Membrane Switches on Silicon," IBM J. Res. Develop., vol. 23, 1979, pp. 376–385 discloses a chemical etching process for fabricating a mechanical switch, which is sensitive to vibrations and has poor insertion loss and isolation. Gretillat et al, "Electrostatic Polysilicon Microrelays Integrated with MOSFETs," in proceedings of Micro Electro Mechanical Systems Workshop, 1994, pp. 97–101 describes a switch for use in a automated testing applications, which exhibits large insertion loss and high frequency capacitive coupling to its polysilicon cantilever arm in its off-state. Yao et al. "A Surface Micromachined Minature Switch for Telecommunications Applications with Signal Frequencies from DC up to 4 GHz" In Tech. Digest, Transducer-95, Stockholm, Sweden, Jun. 25–29, 1995, pp. 384–387 describes a switch for use in RF telecommunications that uses electrostatic actuation to control a silicon dioxide cantilever arm to open and close a signal line, and has an electrical isolation of −50 dB and an insertion loss of 0.1 dB at 4 GHz.

As a type of mechanical relay, one would not normally integrate MEMS switches with microelectronic circuitry such as capacitors, but would instead use them in discrete multi-chip sets. The historical concern is that mechanical parts in general, and relays in particular, are not reliable. In particular, repeated cycles stress the cantilever arm and damage the mechanical contact, which in turn can increase the contact resistance and cause the switch to become welded shut. Furthermore, the switch's cantilever arm is typically very sensitive to vibrations that may cause false on-states. Thus, MEMS switches would be provided as a discrete chip that could be designed to try to reduce these problems, and which could be replaced if the chip should fail. Furthermore, the discrete capacitors can be formed on glass substrates, rather than semi-insulating substrates such as GaAs, which minimizes the parasitic coupling to the substrate.

SUMMARY OF THE INVENTION

In view of the above problems, the present invention provides a monolithically integrated switched capacitor bank using MEMS technology that is capable of handling GHz signal frequencies in both the RF and millimeter bands while maintaining precise digital selection of capacitor levels over a wide tuning range.

In a preferred embodiment, the switched capacitor bank is formed on a semi-insulating substrate. Each MEMS switch includes a cantilever arm that is affixed to the substrate and extends over a ground line and a gapped signal line. An electrical contact is formed on the bottom of the cantilever arm positioned above and facing the gap in the signal line. A top electrode atop the cantilever arm forms a control capacitor structure above the ground line. A capacitor structure, preferably a MEMS capacitor suspended above the substrate at approximately the same height as the cantilever arm, is anchored to the substrate and connected in series with a MEMS switch. The MEMS switch is actuated by applying a voltage to the top electrode, which produces an electrostatic force that attracts the control capacitor structure toward the ground line, thereby causing the electrical contact to close the gap in the signal line and connect the MEMS capacitor structure between a pair of output terminals. The integrated MEMS switch-capacitor pairs have a large range between their on-state and off-state impedance, and thus exhibit superior isolation and insertion loss characteristics.

The MEMS switch-capacitor pairs are preferably fabricated by patterning a metal layer on the substrate to form the ground line and the gapped signal line. A sacrificial layer is formed over the substrate with a thickness of at least 2 microns and patterned to expose a plurality of anchor points on the substrate. A second metal layer is patterned to form the electrical contact that is suspended above the gap in the signal line and to form the MEMS capacitor's bottom electrode. An oxide layer is patterned to form the cantilever arm that is anchored to the substrate and extends above the ground line and the gap in the signal lines and to define a dielectric spacer layer over the MEMS capacitor's bottom electrode. Another metal layer is patterned to form the top electrodes above the ground line and the bottom electrode. Alternately, the second metal layer can be patterned to form a pair of interdigitated capacitor electrodes.

These and other features and advantages of the invention will be apparent to those skilled in the art from the following detailed description of preferred embodiments, taken together with the accompanying drawings, in which:

DETAILED DESCRIPTION OF THE INVENTION

Figure 2:
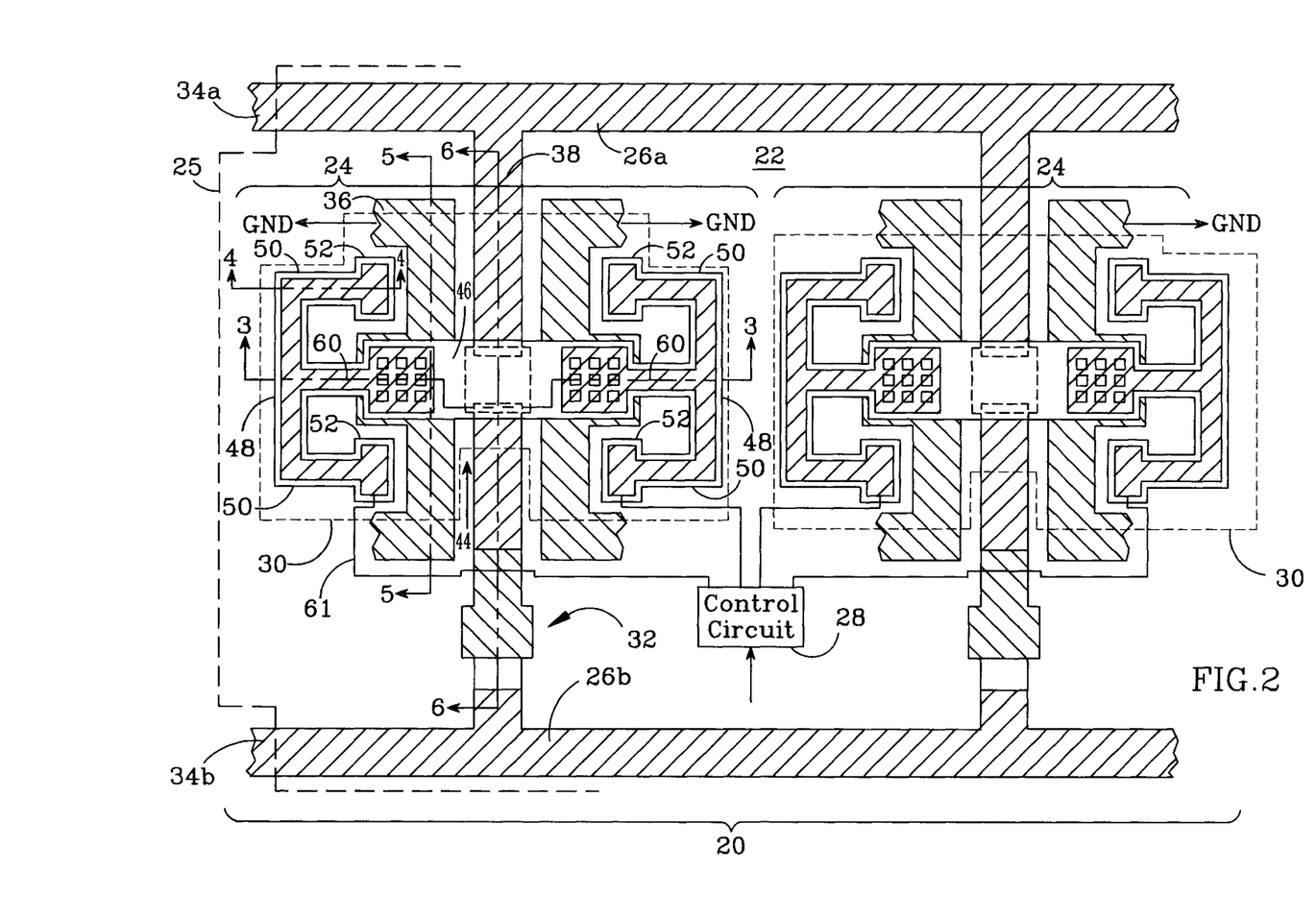
FIG. 2 is a plan view of a preferred embodiment of a monolithically integrated switched capacitor bank using MEMs technology in accordance with the present invention.

The present invention provides a monolithically integrated switched capacitor bank and fabrication method using MEMS technology for applications with signal frequencies from DC up to at least 94 GHz. FIG. 2 shows a schematic top plan view of a portion of a switched capacitor bank 20 micromachined on a substrate 22. FIGS. 3,4,5,and 6 show cross sections of the capacitor bank 20 taken along section lines 3—3, 4—4, 5—5 and 6—6, respectively, of FIG. 2. The micromachined switched capacitor bank has applications in telecommunications systems including adjusting the resonance of a tunable resonator, altering the transfer function of or tuning a filter, or matching a load impedance of an amplifier.

In a preferred embodiment, switched capacitor bank 20 is fabricated on substrate 22, such as a semi-insulating GaAs substrate, using generally known micro fabrication techniques, such as masking, etching, deposition, and lift-off. Substrate 22 is then encapsulated in an IC package 25. The capacitor bank 20 includes a plurality of series-connected MEMS switch-capacitor pairs 24 that are connected in parallel between a pair of output signal lines 26a and 26b. Control circuit 28 digitally controls MEMS switch 30 in each pair to connect and disconnect its capacitor 32 to set the total capacitance seen at a pair of output terminals 34a and 34b (pins on the IC package) to one of a plurality of capacitance levels. Although control circuit 28 is shown as being integrated with switched capacitor bank 20, it may be fabricated on a discrete chip and wire bonded to IC package 25.

Switch 30 preferably includes a pair of bottom electrodes 36, typically a ground line, formed on opposite sides of a signal line 38 on substrate 22. Electrodes 36, signal line 38, and output signal lines 26a and 26b generally comprise microstrips of an oxidization resistance metal, such as gold, deposited on substrate 22. Signal line 38 includes a gap 40, best illustrated in FIG. 6, that is opened and closed by operation of switch 30, as indicated by arrow 42, to connect and disconnect capacitor 32 in parallel between the output signal lines.

The actuating part of switch 30 comprises a cantilevered arm 44, typically formed of an insulating material, such as silicon dioxide or silicon nitride. In the preferred embodiment, the cantilever arm 44, as best illustrated in FIG. 2, forms a suspended folded-cantilever beam that has a center beam portion 46 that extends over and above gap 40 in signal line 38 and past bottom electrodes 36 by a distance L. A pair of cross-beams 48 are formed at their midpoints to opposite ends of center beam 46 and extend perpendicularly therefrom. Two pair of anchor beams 50 are formed on the ends of cross-beams 48 so that they extend back towards signal line 38 approximately parallel to center beam 46 and are affixed to substrate 22 at four anchor points 52 on opposite sides of the two bottom electrodes 36. The folded-cantilever beam structure allows cantilever arm 44 to expand horizontally while switching between the on and off positions, which relieves stress on the arm so that it won't buckle and fail. Anchor beams 50 are preferably the same length L as the portion of center beam 46 that extends past bottom electrodes 36 so that the expand at the same rate and thereby avoid twisting the cantilever arm. The folded-cantilever beam also provides a stiff vertical spring constant, which reduces the switch's sensitivity to vibrations. Alternately, cantilever arm 44 may be designed as a two-anchor structure that forms a bridge over the two bottom electrodes and the gap or as a one-anchor structure that forms a "diving-board" over a single bottom electrode and the gap.

An electrical contact 54 is formed on the bottom side of cantilever arm 44 at the midpoint of its center beam 46 so as to face the top of substrate 22 over and above gap 40 in signal line 38. In the preferred embodiment, electrical contact 54 includes a contact pad 56, suitably 1–10 $\mu$m thick, that comprises a highly conductive, but soft, metal such as gold and a thin surface pad 58, suitably 100–300 Å thick, that comprises a hard metal such as platinum. Without the surface pad 58, contact pad 56 would become damaged and rough over the lifetime of the switch. The rough surface reduces the contact area between electrical contact 54 and signal line 38, which increases the contact resistance to a point that enough heat may be produced to weld the switch shut. Historically, this is a major reason why micromechanical relays have not been integrated in microelectronic circuits. Tests have shown that the hard surface pad 58 substantially eliminates the damage to electrical contact 54 and the underlying signal line 38. The smooth surface maintains the original contact area, and hence the original low contact resistance, approximately 0.1 ohm, that is primarily set by the highly conductive contact pad 56. A pair of top electrodes 60, typically comprising a metal such as aluminum or gold, for example, are formed atop cantilever arm 44. Top electrodes 60 preferably start above the four anchor points 52, extend along anchor beams 52, cross-beams 48 and center beam 46 to end at positions above the pair of bottom electrodes 36. Top electrodes 60 are connected to signal lines 61 at the four anchor points 52 to receive the actuation voltage from control circuit 28. Center beam 46 and top electrodes 60 are broadened above bottom electrodes 36 to form a pair of control capacitor structures 62. As an option to enhance switch actuation performance and to reduce its sensitivity to vibrations, control capacitor structures 62 may be formed to include a grid of holes 63 that extend through top electrodes 60 and center beam 46. The holes, typically having dimensions of 1–100 $\mu$m, for example, reduce the structural mass of cantilever arm 44 and the squeeze film damping effect of air during actuation of switch 20, as indicated by arrow 42.

Figure 6:
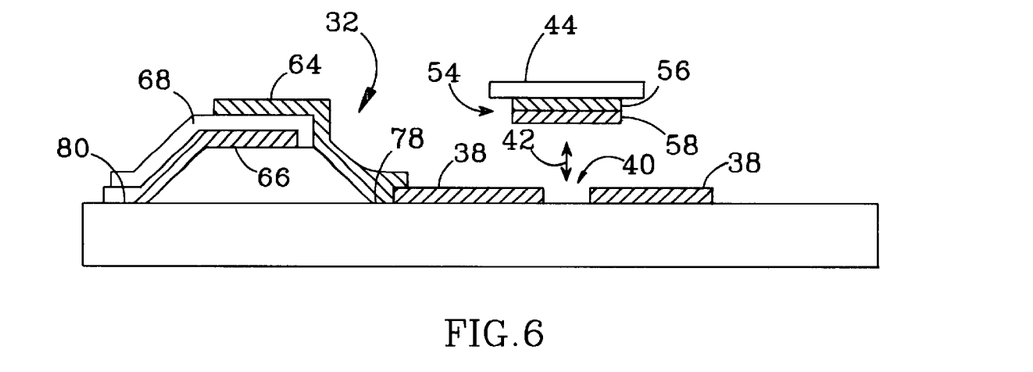
FIG. 6 is a cross section of the switched capacitor bank of FIG. 2 taken along section line 3—3 illustrating the relationship of the electrical contact over the gapped signal line and the suspended parallel-plate capacitor structure.
Figure 7:
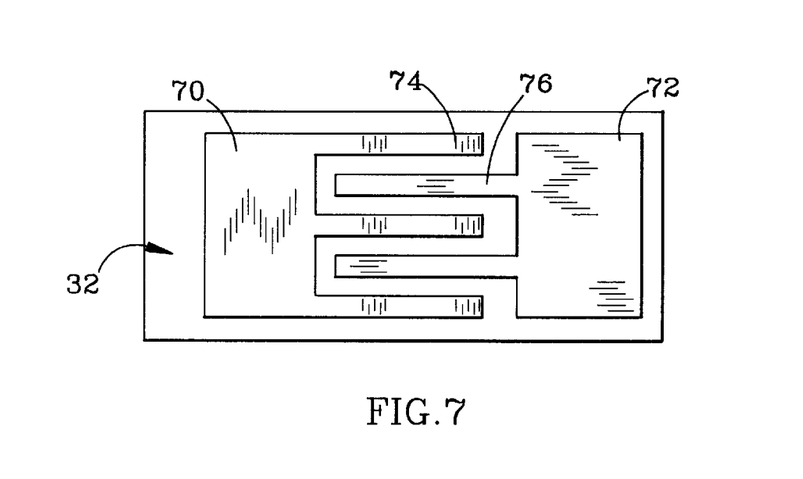
FIG. 7 is a plan view of an alternate suspended interdigitated capacitor structure.

Capacitor 32 is preferably a high Q MEMS capacitor that is suspended above substrate 22 to reduce parasitic coupling. A height of at least 2 microns has been found to substantially eliminate capacitive coupling between capacitor 32 and substrate 22. MEMS capacitor 32 shown in FIG. 6 is a parallel-plate capacitor that includes top and bottom electrodes 64 and 66, respectively, separated by a spacer layer 68, typically formed of an insulating material such as silicon dioxide. Alternately, MEMS capacitor 32 can be formed with a pair of planar electrodes 70 and 72 that have inter-digitated fingers 74 and 76, respectively, as shown in FIG. 7. Furthermore, the capacitor may be formed as a conventional metal-oxide-metal, doped polysilicon-oxide-polysilicon, or metal-oxide-semiconductor (MOS) structure formed on the surface of substrate 22, although its parasitic coupling will limit the signal frequency, tuning range and tuning precision of the capacitor bank. In either of these cases, the electrodes are affixed to substrate 22 at anchor points 78 and 80 to connect capacitor 32 in series with switch 30.

Figure 3:
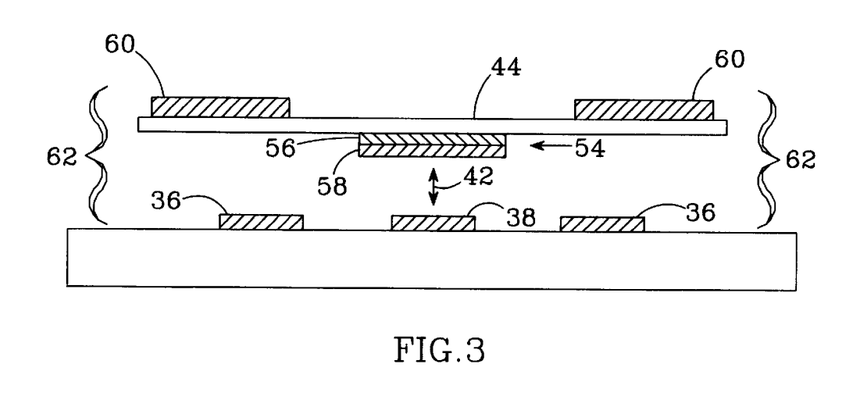
FIG. 3 is a cross section of the switched capacitor bank of FIG. 2 taken along section line 3—3 illustrating the control capacitor's top electrode and the electrical contact on the folded cantilever beam.
Figure 4:
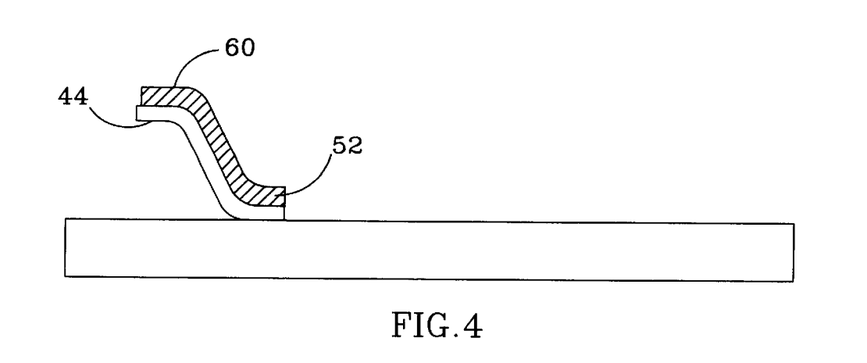
FIG. 4 is a cross section of the switched capacitor bank of FIG. 2 taken along section line 3—3 illustrating the anchoring of the folded cantilever beam to the substrate.
Figure 5:
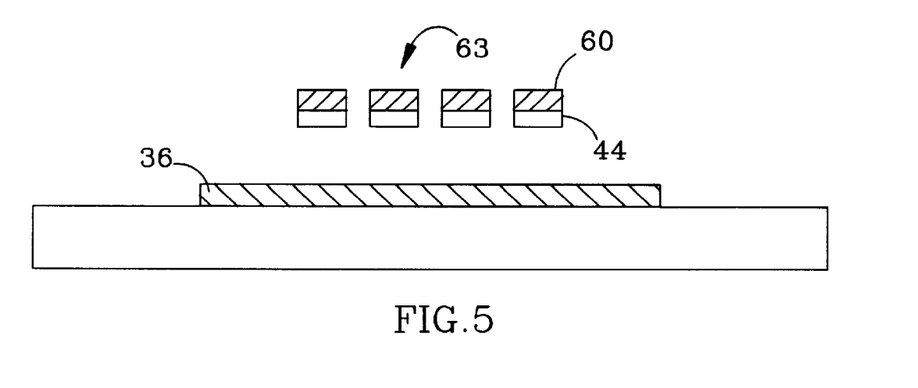
FIG. 5 is a cross section of the switched capacitor bank of FIG. 2 taken along section line 3—3 illustrating the relationship of the control capacitor's top and bottom electrodes.

In operation, each switch 30 in the switched capacitor bank 20 is normally in an "Off" position as shown in FIGS. 3 and 6. With switch 30 in the off-state, signal line 38 is an open circuit due to gap 40 and the separation of electrical contact 54 from signal line 38. The control circuit 28 actuates switch 30 to the "On" position by applying a voltage to the pair of top electrodes 60. With a voltage applied to top electrodes 60 and control capacitor structures 62, which are separated from bottom electrodes 36 by insulating cantilever arm 44, electrostatic forces attract control capacitor structures 62 (and cantilever arm 44) toward bottom electrodes 36. Actuation of cantilever arm 44 toward bottom electrode 36, as indicated by arrow 42, causes electrical contact 54 to come into contact with signal line 38, thereby closing gap 40 and connecting capacitor 32 between output terminals 34a and 34b. This structure provides a very low insertion loss, approximately 0.1 dB at a 4 GHz signal frequency, and a very high isolation, approximately –50 dB at a switching speed of approximately 1 MHz and consumes only about 1.4 $\mu$W to switch from the off-state (open circuit) to the on-state (closed circuit) with a closure time on the order of 30 $\mu$s.

The capacitance seen at the output terminals 34a and 34b of capacitor bank 20 is approximately equal to the sum of the capacitances that are in the "On" state. Because the MEMS switch 30 and suspended capacitor 32 exhibit minimal parasitic coupling to the substrate 22, even at RF and millimeter band frequencies, the error between the actual capacitance seen at the output terminals and the theoretical sum of the individual capacitances is low. Thus, the present switched capacitor bank provides more precise capacitance levels than known capacitor banks.

Furthermore, the known integrated capacitor banks that use planar FET technology, the minimum capacitance value in each switch-capacitor pair is not limited by their parasitic capacitances, and thus can be much lower. As a result, the capacitor bank's effective tuning range may be increased by approximately two orders of magnitude, whether the capacitances are selected to exhibit a linear, logarithmic or binary behavior, for example.

DESIGN TRADE-OFFS

The following description sets forth, by way of example, and not limitation, various component dimensions and design trade-offs in constructing RF and millimeter band switched capacitor bank 20. For the general design of switch 30, silicon dioxide cantilever 44 is typically between 10 $\mu$m and 1000 $\mu$m in length, 1 to 100 $\mu$m in width, and 1 to 10 $\mu$m thick. The grid capacitor structures 62 have a typical area of 100 $\mu m^2$ to 1 $mm^2$. The distance between the bottom of silicon dioxide cantilever 44 and ground line (bottom electrode) 36 and signal line 38 on the substrate is typically 1–10 $\mu$m. The signal line 38 is a gold microstrip that is 1–10 $\mu$m thick, and between 20 $\mu$m and 100 $\mu$m in width. Gold contact pad 56 is 1–10 $\mu$m thick and the platinum surface pad 58 is 100–300 Å thick. The contact area is on average 10–10,000 $\mu m^2$.

At low frequencies, the insertion loss of switch 30 is dominated by the resistive loss of signal line 38, which includes the resistance of signal line 38 and the resistance of electrical contact 54. At higher frequencies, the insertion loss can be attributed to both the resistive loss and the skin depth effect. For frequencies below 4 GHz, the skin depth effect is much less significant than the resistive loss of signal line 38. To minimize the resistive loss, a thick layer (2 μm) of gold is used. The width of signal line 38 is a more limited variable than the thickness because the wider the signal lines, the lower the insertion loss, but also the poorer the 'Off' state electrical isolation because of the increased capacitive coupling between the signal lines. In addition, a change in the microstrip signal line will also affect its microwave impedance. Gold is also used for its superior electromigration characteristics.

Electrical isolation of switch 30 in the 'Off' state mainly depends on the capacitive coupling between signal line 38 and substrate 22, whether the substrate is conductive or semi-conductive, or the capacitive coupling between the signal lines. Therefore, the semi-insulating GaAs substrate is chosen for the switch 30 over a semi-conducting silicon substrate. GaAs substrates are used instead of other insulating substrates such as glass so that the switch may retain its monolithic integration capability with MMICs.

The capacitive coupling between the signal lines on the substrate may be reduced by increasing the distance between signal line 38 on substrate 22 and electrical contact 54 on the bottom of the suspended silicon dioxide cantilever 44. However, increasing the distance also increases the voltage required to actuate switch 30 because the same distance also determines the actuation capacitance. The aluminum in top electrode 60 of control capacitor 62 couples to the underlying gold ground line (bottom electrode) 36. For a fixed distance, the voltage required to actuate the switch may be reduced by increasing the area of the control capacitor. However, this increase in the capacitor area increases the overall mass of the suspended structure and thus the closure time of the switch. If the stiffness of the suspended structure is increased to compensate for the increase in the structure mass, the voltage required to actuate the switch must be further increased to maintain a constant switch closure time. In addition, to minimize insertion loss, the contact metal (contact and surface pads 56 and 58) on the silicon dioxide cantilever must be as thick as possible to reduce the resistive loss. This thick gold and platinum contact metal also contributes to the overall structural mass.

The optional grid of holes 63 in the control capacitor structure reduces the structural mass while maintaining the overall actuation capacitance by relying on the fringing electric fields of the grid structures. In addition, the grid structure reduces the atmospheric squeeze damping between the cantilever arm 44 and the substrate 22. Switches without the grid design generally have a much larger closure and opening time due to the squeeze damping effect.

The MEMS capacitor structure 32 has a typical area of 10 $\mu m^2$ to 1 $mm^2$ and a spacer layer thickness of 0.1 μm to 4 μm. The precise dimensions will depend greatly on both the desired operating signal frequency and the desired capacitance values. Both types of MEMS capacitors are preferably suspended at least 4 μm above the substrate 22 to minimize the parasitic coupling.

FABRICATION

The switched capacitor bank is manufactured using a surface micromachining technique with a total of six masking levels. No critical overlay alignment is required. The starting substrate for the preferred embodiment is a semi-insulating GaAs wafer. Silicon dioxide ($SiO_2$) deposited using plasma enhanced chemical vapor deposition (PECVD) technique is used as the preferred structural material for cantilever arm 44, and polyimide is used as the sacrificial material. FIGS. 8A–I and 9A–I are cross-sectional illustrations of the process sequence as it affect sections 5—5 and 6—6, respectively, of switched capacitor bank 20 shown in FIG. 2.

Figure 8A:
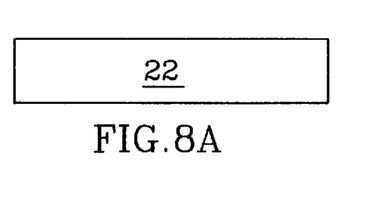
FIGS. 8a through 8i are cross sections illustrating the steps in fabricating the section of the switched capacitor bank shown in FIG. 5.
Figure 9A:
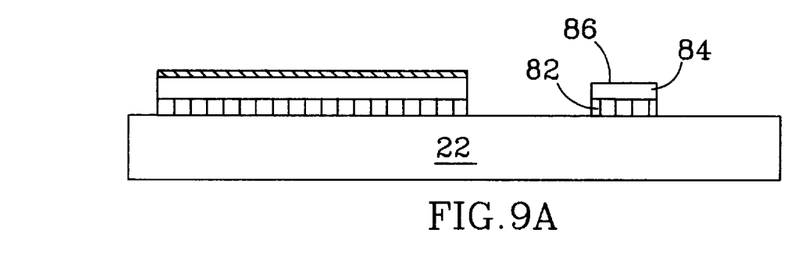
FIGS. 9a through 9i are cross sections illustrating the steps in fabricating the section of the switched capacitor bank shown in FIG. 6.

As shown in FIGS. 8A and 9A, a liftoff profile has been formed on the GaAs wafer 22 to expose the portions of its surface where the signal line 38 and bottom electrode 38 (shown in FIG. 2) are to be fabricated. One way to accomplish this is by spinning a first sacrificial layer 82 of thermal setting polyimide (DuPont PI2556) onto the wafer and curing it via a sequence of oven bakes with the highest baking temperature of 250° C. A layer 84 of pre-imidized polyimide (OCG Probimide 285) is then spun on and baked with the highest baking temperature of 170° C. A 1500 Å thick silicon nitride layer 86 is then deposited and patterned using photolithography and reactive ion etch (RIE) in $CHF_3$ and $O_2$ chemistry. The pattern is then transferred to the underlying polyimide layers via $O_2$ RIE.

Figure 8B:
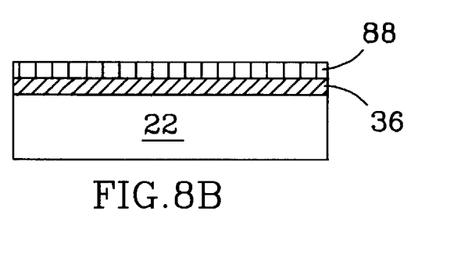
Figure 9B:
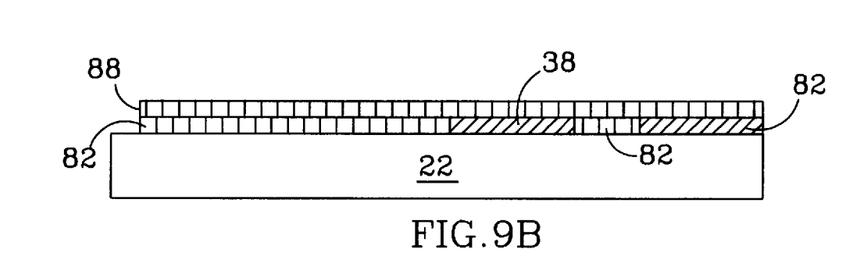

As shown in FIGS. 8B and 9B, a layer of gold has been electron beam evaporated with a thickness equal to that of the thermal set DuPont polyimide layer 82 to form bottom electrode 36 and signal line 38. The gold liftoff is completed using methylene chloride to dissolve the pre-imidized OCG polyimide, leaving a planar gold/polyimide surface. The cross linked DuPont polyimide has good chemical resistance to methylene chloride. A second sacrificial layer 88 of thermal setting polyimide (DuPont PI2555) is spun on and thermally cross linked to the wafer.

Figure 8C:
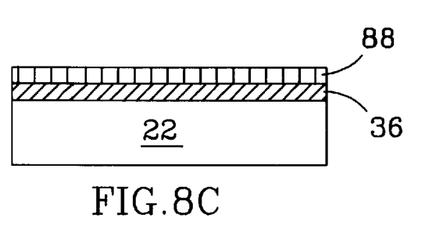
Figure 8D:
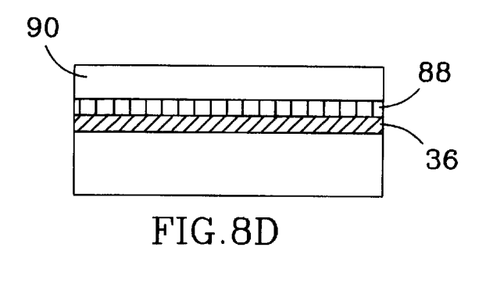
Figure 8E:
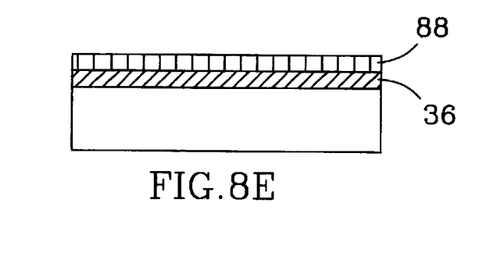
Figure 9C:
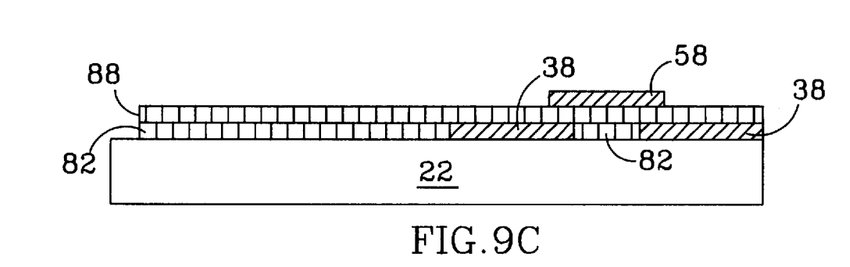
Figures 9D, 9E:
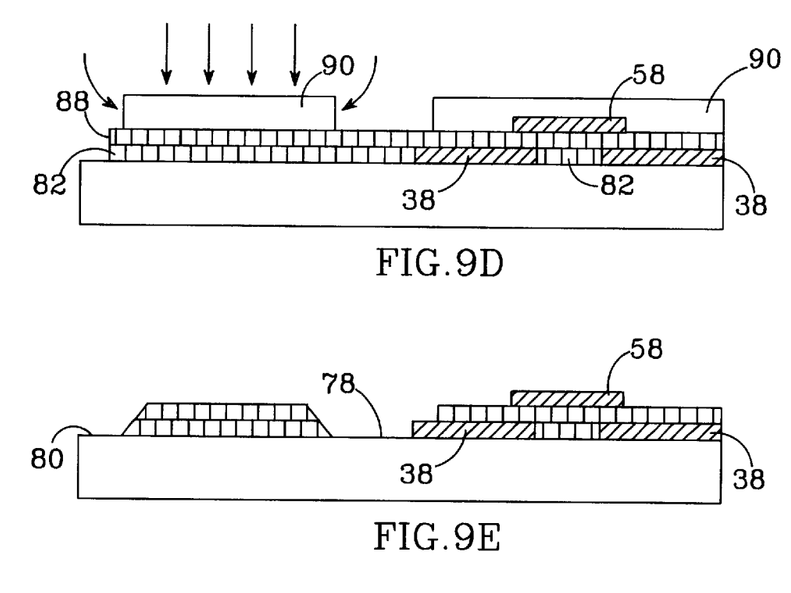

As shown in FIGS. 8C and 9C, a layer of 200 Å μm platinum has been deposited using electron beam evaporation and liftoff to form the thin surface pad 58 shown in FIG. 6. As shown in FIGS. 8D–E and 9D–E, the sacrificial material in layers 82 and 88 exposed through a mask 90 is etched away to expose the anchor points 52 (shown in FIG. 2) for the switch and anchor points 78 and 80 for the capacitor. The etching process undercuts the mask 90 so that the sacrificial material has the slope needed to bring the top electrodes 60 and 64 (shown in FIGS. 4 and 6) down from their elevated levels to the surface of the substrate.

Figure 8F:
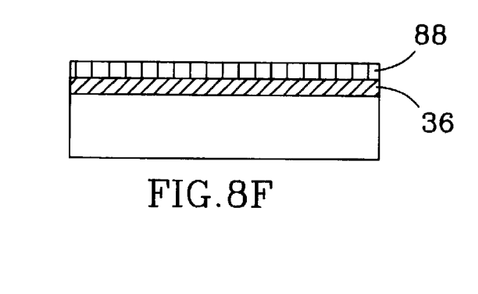
Figure 8G:
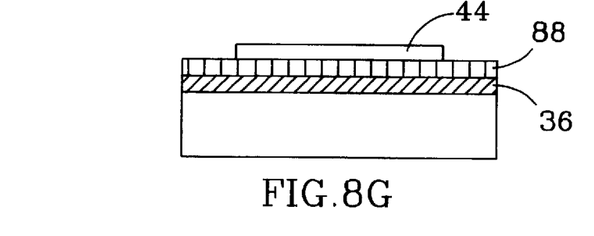
Figure 8H:
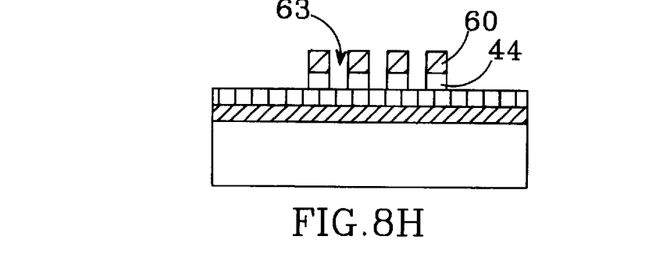
Figure 8I:
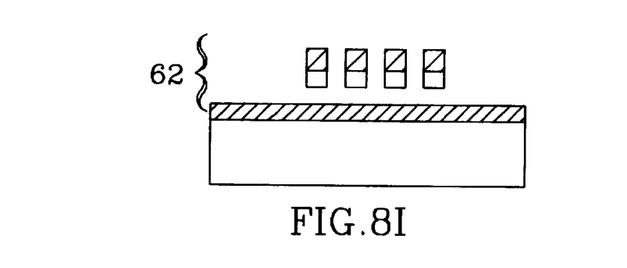
Figure 9F:
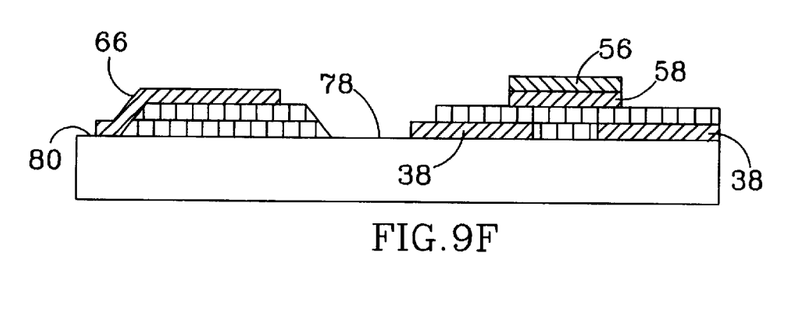
Figure 9G:
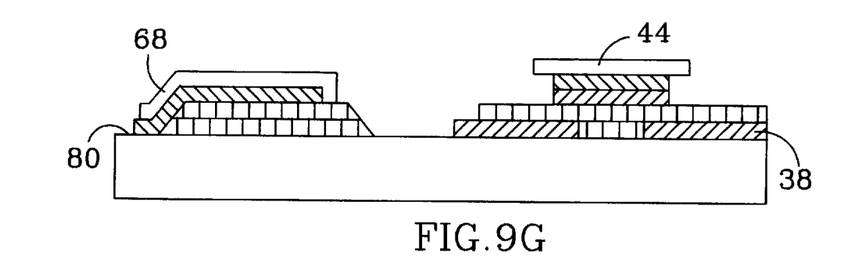
Figure 9H:
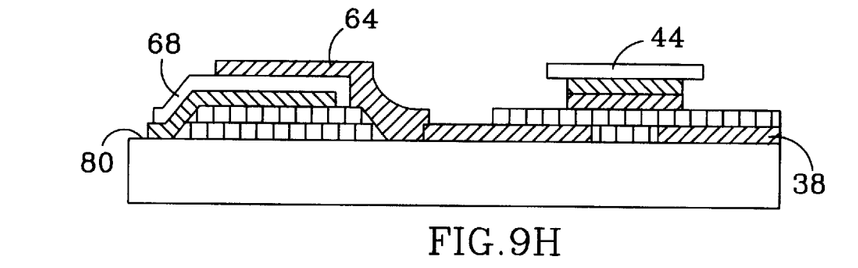
Figure 9I:
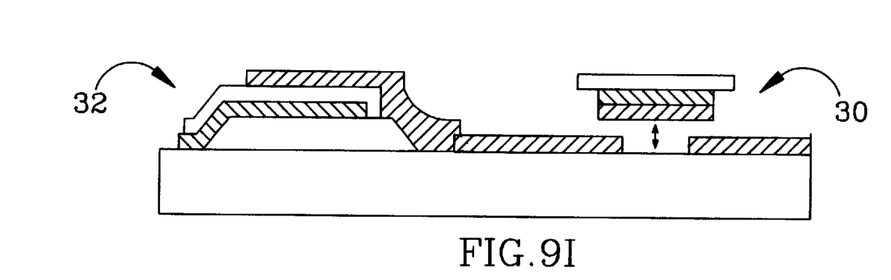

As shown in FIGS. 8F and 9F, a layer of 1 μm gold is deposited using electron beam evaporation and liftoff to form the contact pad 56 and the bottom electrode 66 of the suspended capacitor 32. A 2 μm thick layer of PECVD silicon dioxide film is then deposited and patterned using photolithography and RIE in $CHF_3$ and $O_2$ chemistry to form cantilever arm 44 and spacer layer 68 (FIGS. 8G and 9G). A thin layer (2500 Å) of aluminum film is then deposited using electron beam evaporation and liftoff to form the control capacitor's top electrode 60 and the MEMS capacitor's top electrode 64 (FIGS. 8H and 9H). Optionally, the capacitor's top electrode 60 can be masked and etched through the underlying silicon dioxide to form the grid of holes 63. And lastly, the entire switched capacitor bank structure is released by dry etching the polyimide films 82 and 88 in a Branson $O_2$ barrel etcher (FIGS. 8I and 9I). The dry-release is preferred over wet chemical releasing methods to prevent any potential sticking problems during release.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A monolithically integrated switched capacitor bank, comprising:
   a substrate;
   a pair of output signal lines on said substrate that terminate at respective output terminals;
   a plurality of micro electro mechanical system (MEMS) switches on said substrate; and
   a plurality of capacitors on said substrate, each of said switches integrated with a respective one of said plurality of capacitors on said substrate to form a series-connected switch-capacitor pair, said switch-capacitor pairs connected in parallel between the pair of output signal lines, each of said MEMS switches switching in response to a respective control signal to connect and disconnect its respective capacitor to set a total capacitance seen at said output terminals to one of a plurality of levels.

2. The switched capacitor bank of claim 1, wherein each said capacitor comprises a pair of conductive electrodes that are anchored to said substrate and suspended above said substrate so that the parasitic capacitance between said electrodes and said substrate is low.

3. The switched capacitor bank of claim 2, wherein said capacitor comprises a parallel-plate capacitor in which said conductive electrodes are parallel to and spaced apart from each other and said substrate.

4. The switched capacitor bank of claim 2, wherein said capacitor comprises an interdigitated capacitor in which said conductive electrodes lie in a common plane above said substrate and have a plurality of interdigitated fingers.

5. The switched capacitor bank of claim 1, further comprising an integrated control circuit formed on said substrate that generates said control signals.

6. A monolithically integrated switched capacitor bank, comprising:
   a substrate;
   a pair of output signal lines on said substrate that terminate at respective output terminals; and
   a plurality of series-connected micro electro mechanical system (MEMS) switch-capacitor pairs on said substrate that are connected in parallel between the pair of output signal lines, each said MEMS switch switching in response to a control signal to connect and disconnect its capacitor to set a total capacitance seen at said output terminals to one of a plurality of levels, each of said MEMS switch-capacitor pairs comprising:
      a bottom electrode and a switch signal line formed on the substrate, said switch signal line having a first end that is connected to one of said output signal lines, a second end, and a gap forming an open circuit;
      a cantilever arm formed of insulating material affixed to said substrate and suspended above said bottom electrode and said gap in said switch signal line;
      an electrical contact formed on said cantilever arm positioned facing said gap in said switch signal line;
      a top electrode formed atop said cantilever arm, a portion of said cantilever arm and said top electrode positioned above said bottom electrode forming a first capacitor structure that is electrostatically attractable toward said bottom electrode upon selective application of a voltage to said top electrode;
      a pair of capacitor anchor structures formed on said substrate, one said capacitor anchor structure being electrically connected to the second end of said switch signal line and the other capacitor anchor structure being electrically connected to the other said output signal line; and
      a pair of capacitor electrodes that are connected to the respective capacitor anchor structures to form a second capacitor structure,
      said electrostatic attraction of said first capacitor structure toward said bottom electrode causing said electrical contact on said cantilever arm to close said gap in said switch signal line thereby connecting said second capacitor structure between said output terminals.

7. The switched capacitor bank of claim 6, wherein said pair of capacitor electrodes is suspended above said substrate so that the parasitic capacitance between said second capacitor structure and said substrate is low.

8. The switched capacitor bank of claim 7, wherein said cantilever arm and said second capacitor structure are suspended above said substrate at approximately the same height.

9. The switched capacitor bank of claim 8, wherein said second capacitor structure comprises a parallel-plate capacitor in which said pair of capacitor electrodes are parallel to and spaced apart from each other.

10. The switched capacitor bank of claim 6, wherein said second capacitor structure comprises an interdigitated capacitor in which said pair of capacitor electrodes lies in a common plane above said substrate and have a plurality of interdigitated fingers.

11. The switched capacitor bank of claim 6, wherein said substrate comprises a semi-insulating gallium arsenide substrate.

12. The switched capacitor bank of claim 6, wherein said first capacitor structure further comprises a grid of holes extending through said cantilever arm and said top electrode.

13. The switched capacitor bank of claim 6,
   further comprising another pair of bottom and top electrodes respectively formed on said substrate and atop said cantilever arm thereby forming a third capacitor structure electrostatically attractable toward said bottom electrode upon selective application of a voltage to said top electrode, said first and third capacitor structures being positioned on opposite sides of said switch signal line.

14. The switched capacitor bank of claim 13, wherein said cantilever arm comprises a) first and second pairs of anchors, which are formed on said substrate on opposite sides of said first and third capacitor structures, respectively, and approximately perpendicular to said cantilever arm, b) a suspended center beam that traverses the gap in said switch signal line approximately perpendicularly, supports both of said top electrodes and extends past them a selected distance, c) a pair of suspended cross beams that are affixed at their midpoints to opposite ends of said center beam approximately perpendicularly, and d) first and second pairs of anchor beams that are respectively affixed to the ends of the cross beams, extend towards the switch signal line approximately parallel to the center beam, and are affixed to the first and second pairs of anchors, respectively, said cantilever arm expanding in response to the electrostatic attraction of said first and third capacitor structures to relieve stress on itself.

15. The switched capacitor bank of claim 14, wherein the length of said first and second pairs of anchor beams is approximately equal to the selected distance that said center beam extends past said first and third capacitor structures to reduce twisting when said cantilever arm expands.

16. The switched capacitor bank of claim 15, wherein said cantilever arm comprises silicon dioxide.

17. The switched capacitor bank of claim 6, wherein said electrical contact comprises:
- a first metal layer formed on said cantilever arm and positioned facing said gap in said switch signal line, said first metal layer comprising a highly conductive and relatively soft metal that would be susceptible to damage during repeated contacts to said switch signal line; and
- a second metal layer formed on said first metal layer and positioned facing said gap, said second metal layer comprising a metal that has lower conductivity than the metal in said first metal layer but is relatively hard so that it is not susceptible to damage when repeatedly contacted to said switch signal line, said first and second metal layers together providing said highly conductive electrical contact.

18. A monolithically integrated switched capacitor bank, comprising:
- a substrate;
- a pair of output signal lines on said substrate that terminate at respective output terminals; and
- a plurality of series-connected micro electro mechanical system (MEMS) switch-capacitor pairs on said substrate that are connected in parallel between the pair of output signal lines, each said MEMS switch switching in response to a control signal to connect and disconnect its capacitor to set a total capacitance seen at said output terminals to one of a plurality of levels, each said MEMS switch-capacitor pair, comprises:
    - a bottom electrode and a switch signal line formed on the substrate, said switch signal line having a first end that is connected to one of said output signal lines, a second end, and a gap forming an open circuit;
    - a cantilever arm formed of insulating material affixed to said substrate and suspended above said bottom electrode and said gap in said switch signal line;
    - an electrical contact formed on said cantilever arm positioned facing said gap in said switch signal line;
    - a top electrode formed atop said cantilever arm, a portion of said cantilever arm and said top electrode positioned above said bottom electrode forming a first capacitor structure that is electrostatically attractable toward said bottom electrode upon selective application of a voltage to said top electrode;
    - a pair of capacitor anchor structures formed on said substrate, one said capacitor anchor structure being electrically connected to the second end of said switch signal line and the other capacitor anchor structure being electrically connected to the other said output signal line; and
    - a pair of capacitor electrodes that are connected to the respective capacitor anchor structures and suspended above the substrate to form a second capacitor structure whose parasitic capacitance to said substrate is low,
    - said electrostatic attraction of said first capacitor structure toward said bottom electrode causing said electrical contact on said cantilever arm to close said gap in said switch signal line thereby connecting said second capacitor structure between said output terminals.

19. The switched capacitor bank of claim 18, wherein said cantilever arm and said second capacitor structure are suspended above said substrate at approximately the same height.

20. The switched capacitor bank of claim 18, wherein said second capacitor structure comprises a parallel-plate capacitor in which said pair of capacitor electrodes are parallel to and spaced apart from each other.

21. The switched capacitor bank of claim 18, wherein said second capacitor structure comprises an interdigitated capacitor in which said pair of capacitor electrodes lies in a common plane above said substrate and have a plurality of interdigitated fingers.

22. The switched capacitor bank of claim 18,
further comprising another pair of bottom and top electrodes respectively formed on said substrate and atop said cantilever arm thereby forming a third capacitor structure electrostatically attractable toward said bottom electrode upon selective application of a voltage to said top electrode, said first and third capacitor structures being positioned on opposite sides of said switch signal line.

23. The switched capacitor bank of claim 22, wherein said cantilever arm comprises a) first and second pairs of anchors, which are formed on said substrate on opposite sides of said first and third capacitor structures, respectively, and approximately perpendicular to said cantilever arm, b) a suspended center beam that traverses the gap in said switch signal line approximately perpendicularly, supports both of said top electrodes and extends past them a selected distance, c) a pair of suspended cross beams that are affixed at their midpoints to opposite ends of said center beam approximately perpendicularly, and d) first and second pairs of anchor beams that are respectively affixed to the ends of the cross beams, extend towards the switch signal line approximately parallel to the center beam, and are affixed to the first and second pairs of anchors, respectively, said cantilever arm expanding in response to the electrostatic attraction of said first and third capacitor structures to relieve stress on itself.

24. The switched capacitor bank of claim 23, wherein the length of said first and second pairs of anchor beams is approximately equal to the selected distance that said center beam extends past said first and third capacitor structures to reduce twisting when said cantilever arm expands.

25. A monolithically integrated switched capacitor bank, comprising:
- a substrate;
- a pair of output signal lines on said substrate that terminate at respective output terminals; and
- a plurality of series-connected micro electro mechanical system (MEMS) switch-capacitor pairs on said substrate that are connected in parallel between the pair of output signal lines, each said MEMS switch switching in response to a control signal to connect and disconnect its capacitor to set a total capacitance seen at said output terminals to one of a plurality of levels, each said MEMS switch-capacitor pair, comprises:
    - a patterned first metal layer on said substrate that defines a first bottom electrode, and a switch signal line on the substrate, said switch signal line having a first end that is connected to one of said output signal lines, a second end, and a gap forming an open circuit;
    - a patterned second metal layer that defines an electrical contact suspended above said substrate facing said gap in said switch signal line and to define a second bottom electrode that is anchored to and suspended above said substrate;
    - a patterned oxide layer that defines a cantilever arm that is anchored to said substrate and suspended above said bottom electrode and said gap in said switch signal line to support said electrical contact and to define a dielectric spacer layer over said second bottom electrode; and a patterned third metal layer on said oxide layer that defines first and second top electrodes above the first and second bottom electrodes, respectively, said first top and bottom electrodes forming a first capacitor structure that is electrostatically attractable toward said bottom electrode upon selective application of a voltage to said top electrode, said second top and bottom electrodes forming a second capacitor structures whose parasitic capacitance to said substrate is low, said electrostatic attraction of said first capacitor structure toward said bottom electrode causing said electrical contact on said cantilever arm to close said gap in said switch signal line thereby connecting said second capacitor structure between said output terminals.

26. The switched capacitor bank of claim 25, wherein said substrate comprises a semi-insulating gallium arsenide substrate, said first, second and third metal layers comprise gold, and said oxide layer comprises silicon dioxide.

27. The switched capacitor bank of claim 26, further comprising a platinum layer patterned on the underside of the second metal layer to form a hard surface on said electrical contact to reduce the damage caused by repeated contact to said switch signal line.

28. The switched capacitor bank of claim 25, wherein the cantilever arm defined by the patterned oxide layer has a folded-cantilever beam structure that is anchored to the substrate at four different places so that said cantilever arm can expand in response to the electrostatic attraction of said first and third capacitor structures to relieve stress on itself.

* * * * *